Jan. 26, 1971 R. W. BOWERS 3,559,054

METHOD OF AND APPARATUS FOR MECHANICALLY AND ELECTRICALLY TESTING THE QUALITY OF JOINTS BONDING A CHIP DEVICE TO THE SURFACE OF THE SUBSTRATE OF A MICROMINIATURE MODULE

Filed Nov. 15, 1965

INVENTOR
RONALD W. BOWERS

BY Joseph L. Spiegel
ATTORNEY

United States Patent Office 3,559,054
Patented Jan. 26, 1971

3,559,054

METHOD OF AND APPARATUS FOR MECHANICALLY AND ELECTRICALLY TESTING THE QUALITY OF JOINTS BONDING A CHIP DEVICE TO THE SURFACE OF THE SUBSTRATE OF A MICROMINIATURE MODULE

Ronald W. Bowers, Poughkeepsie, N.Y., assignor to International Business Machines Corporation, Armonk, N.Y., a corporation of New York Filed Nov. 15, 1965, Ser. No. 507,833
Int. Cl. G01n 27/02
U.S. Cl. 324—62 1 Claim

ABSTRACT OF THE DISCLOSURE

The joints bonding a chip device to the surface of the substrate of a microminiature module are tested using means for supporting the module, a high velocity nozzle from which a high pressure, high velocity air blast is directed towards the fixedly held module and monitoring means for detecting changes in electrical resistance across the joint. It has been observed that when the chip-substrate joint of the microminiature module is subjected to a high velocity, low pressure air blast, chips very weakly bound, either at the chip to chip contact connection, or the chip contact to substrate circuit pattern connection, will be blown off the substrate by the force of the air blast. Further, poor or intermittent bonded joints or connections when subjected to an air blast will undergo changes in resistance which can be detected in an appropriate circuit. Great accuracy is achieved in detecting these changes by pulsing the air blast and electrically coupling the joint to a trigger circuit, provided trigger circuit response is much shorter than pulse duration.

This invention relates to a method of and apparatus for mechanically and electrically testing the quality of bonded joints, and in particular to developing mechanical forces in evaluating a bonded joint between first and second objects, typically a microminiature chip device attached to a printed circuit board or substrate, while simultaneously monitoring the bonded joint electrically for detecting changes in resistance.

Many information handling systems are based upon a plurality of "building block" circuits which are conveniently interconnected to perform any desired logic function, for example, arithmetic, data storage and the like. One approach to the fabrication of such building blocks is to microminiaturize individual active and passive devices and fasten them to a miniaturized substrate. This approach, generally referred to as microminiaturized circuitry, is discussed briefly in the periodical "Electronics" published by McGraw-Hill, Feb. 15, 1963 at pages 45–60.

In microminiaturized circuits passive devices such as resistors, and active devices or "chips" such as transistors and/or diodes are secured to substrates of the order of 0.45" x 0.45" x 0.06". The chips, as one example, which are to be secured to the substrate are of the order of .028" x .028" and interconnection of these chips to the substrate is a particular problem. For a connection or bonded joint to be rated acceptable, it must have sufficient strength to withstand normal shock and vibration associated with information handling systems. Its electrical and mechanical characteristics must not deteriorate or change under extreme humidity conditions normally associated with such systems. Additionally, the interconnection must not short circuit to the semiconductor body. The bonded joint should also have a melting point sufficiently high that it will not be affected during any soldering of the substrate to a supporting card. Finally, the bonding materials should not produce a doping action in the chip device.

One particularly satisfactory bonding technique, meeting all of the above requirements, generally referred to as the solder reflow method is described in more in detail in a copending application entitled "Method of and Apparatus for Fabricating Microminiature Functional Components" by R. D. McNutt et al., Ser. No. 300,855, filed Aug. 8, 1963, now U.S. Pat. 3,292,240 issued Dec. 20, 1966, and assigned to the same assignee as the present invention. This application describes a solder reflow joint established between built-up contacts on chip devices and a solder coated circuit topology or land pattern on a substrate surface.

Despite the efficacy of the previously described bonding technique, minute dirt particles on the built-up contacts or on the solder coated circuit topology or misalignment between the chip and substrate reduce the effectiveness of the bonded joint. Adequate testing of devices is required to insure that all modules will satisfy the criteria previously indicated, for their lifetime. In the past this testing has been a visual inspection under microscope which is extremely slow, tedious, expensive and rarely definitive of the quality of the bonded joint.

A general object of the present invention is an apparatus for and method of mechanically and electrically testing the quality of bonded joints.

Another object is the application of mechanical forces to a bonded joint between a microminiature chip and substrate.

Still another object is electrically monitoring bonded joints included in microcircuits for detecting changes in resistance while the bonded joint is being subjected to mechanical forces.

A further object is the simultaneous testing of the bonded joints between connection terminals attached to a chip device and to a circuit pattern formed on the surface of a substrate or printed circuit board.

These and other objects are accomplished in accordance with the present invention, one illustrative embodiment of which comprises means for supporting a microminiature module having a plurality of semiconductor chips bonded to a substrate, a high velocity nozzle from which a high pressure, high velocity air blast is directed toward the module means fixedly held, and monitoring means for detecting changes in electrical resistance of the bonded joint connecting the chip to the substrate. It has been observed that when the chip-substrate bonded joint of the microminiature module is subjected to a high velocity, low pressure air blast, chips very weakly bound, either at the chip to chip contact connection, or the chip contact to substrate circuit pattern connection, will be blown off the substrate by the force of the air blast. Further, poor or intermittent bonded joints or connections when subjected to an air blast will undergo changes in resistance which can be detected in an appropriate circuit. Great accuracy is achieved in detecting these changes by pulsing the air blast, and electrically coupling the module to a trigger circuit, provided trigger circuit response is much shorter than pulse duration.

One feature of the present invention is the provision of apparatus for testing the bonded joint between a chip device attached to the surface of a substrate of a microminiature module including means for supporting the module and means for subjecting the bonded joint to a blast of fluid medium.

Another feature is means for detecting changes in resistance when the relatively small bonded joint is subjected to the blast.

Still another feature is resistance change detecting means comprising a test circuit having test terminals for electrically coupling the module into the test circuit, a source of test current, the module, and means responsive to the current flow in the test circuit for detecting changes in resistance when the bonded joint is subjected to the blast.

A further feature is means for pulsing the blast, and a trigger circuit electrically connected to the module having means for detecting changes in resistance when the bonded joint is subjected to the blast pulse, the trigger circuit response being much shorter than the pulse duration.

The foregoing and other objects, features and advantages of the invention will be apparent from the following more particular description of the preferred embodiments of the invention as illustrated in the accompanying drawings.

Figure 1:
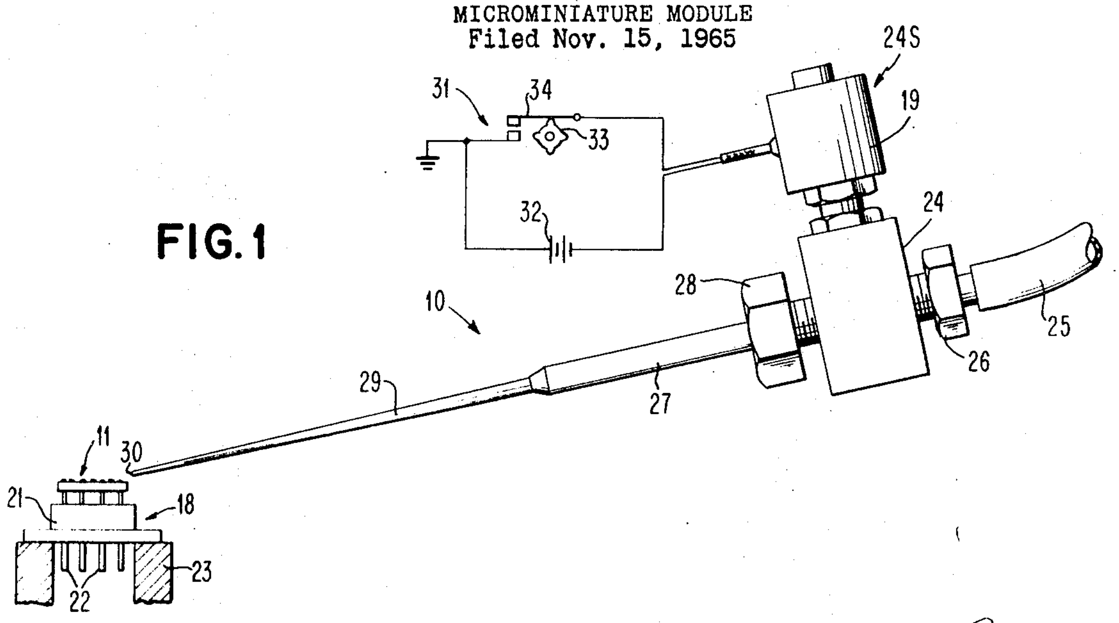
FIG. 1 is an elevational side view of the novel bond tester apparatus of the present invention with solenoid energizing circuitry shown in schematic.

Referring now to the drawings there is disclosed one illustrative embodiment of the bond tester apparatus 10 of the present invention illustrated in connection with the testing of microminiature functional components or modules 11.

Each module 11 includes a substrate 12 having extending contact pins 13. The substrate 12 is a good thermal conductor and has excellent thermal properties. One material found to satisfy these criteria is a composition of 95% alumina which is pressed or otherwise formed into a suitable geometric configuration, typically a 0.45" square. A conductive pattern 14 of unique topology is printed on the substrate surface 15 and subsequently tinned with solder. The pattern 14 may represent any particular circuit configuration and is joined to two or more contact pins 13 to provide electrical contact from active and passive devices on the substrate 12 to utilization apparatus (not shown). Thereafter, the raised contacts 16, typically spherical of one or more chip devices 17 are bonded, for example, by solder reflow technique to the pattern 14 on the substrate surface 15. Further details relative to the modules are given in a previously filed application, Ser. No. 300,734, filed Aug. 8, 1963 and assigned to the same assignee as the present invention.

Referring to FIG. 1, each module 11 to be tested is fixedly held in place by support means 18 and subjected to an air blast from an air blast means 19. Simultaneously, the bonded joints under test are monitored in an appropriate test circuit 20 (FIG. 2) for detecting changes in resistance.

Support means 18 includes a socket 21 mounted on and having pins 22 extending through a chassis 23. Module pins 13 are inserted in socket pins 13 for holding module 11 fixedly in place when subjected to an air blast and for establishing electrical contact to test circuit 20, to be described hereafter.

The air blast means 19 (When the term "air" is used herein, it is deemed to include any suitable fluid medium.) includes solenoid operated air valve 24, tubing 25 connected between a high pressure air source (not shown), typically 400 pounds per square inch, and a valve input coupling 26, tubing 27 secured to a valve output coupling 28, and a long tapering discharge passage 29 secured at one end to tubing 27 and turned down at the opposite end to form a discharge nozzle 30, typically .060" diameter.

A solenoid energizing circuit 31 for actuating the air blast means 19 includes the solenoid **24*s* of air valve 24, power supply 32 and cam 33 actuated microswitch 34. Rotation of cam 34 alternately opens and closes microswitch 34, to alternately deenergize and energize solenoid 24*s* resulting in a pulsed air blast from nozzle 30**.

Figure 2:
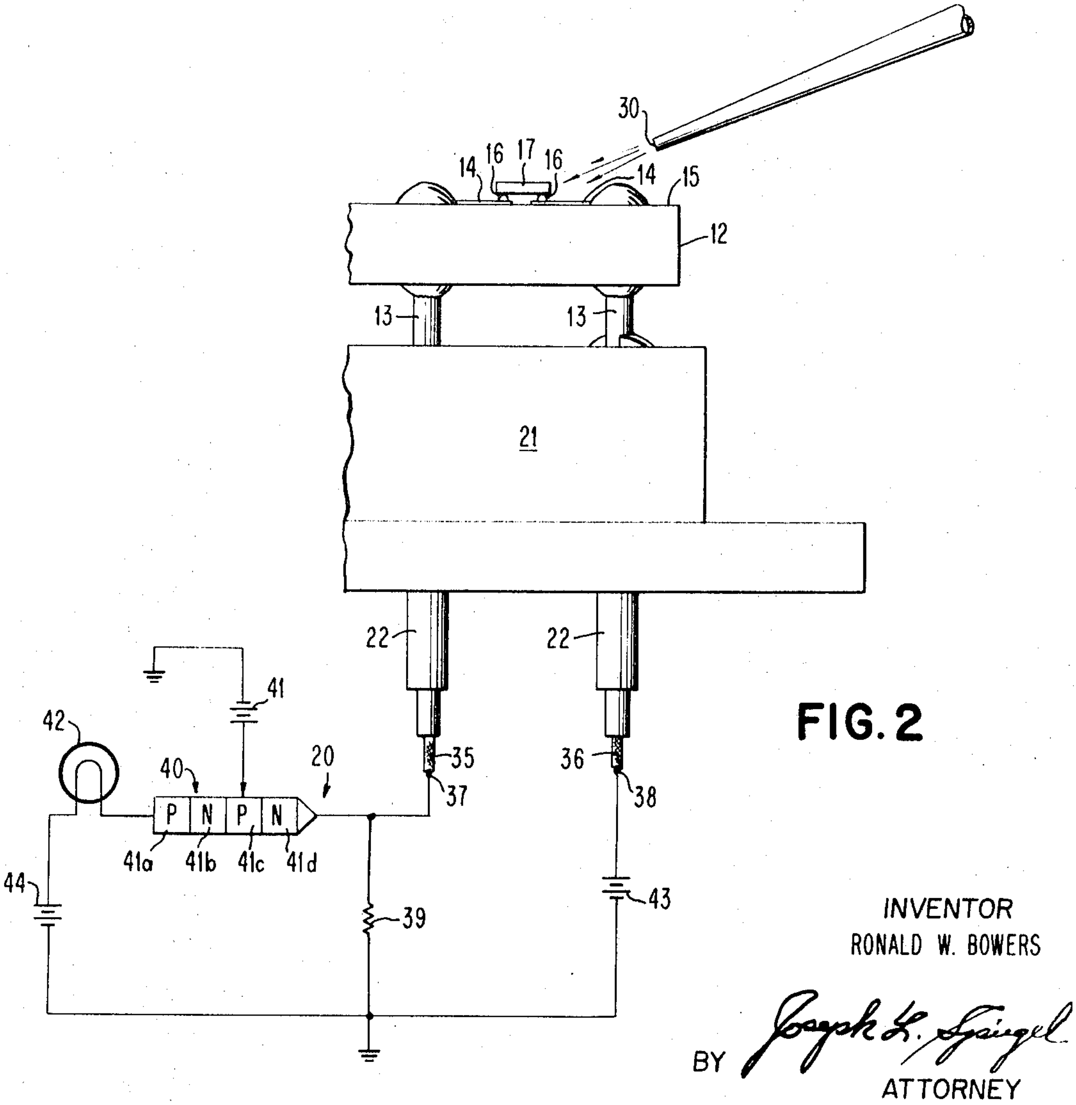
FIG. 2 is an enlarged view of a portion of the module, socket and nozzle tip shown in FIG. 1, together with the accompanying test circuitry shown in electrical schematic.

Referring now to FIG. 2 each module 11 to be tested is connected through lead wires 35, 36 from socket pins 22 to test circuit 20. Test circuit 20 includes test terminals 37, 38, sensing resistor 39, switching device 40, bias source 41, detector lamp 42, bias source 43 and a source of current for detector lamp 42 from a power supply 44.

Switching device 40 can be a conventional power device. One device found to be satisfactory is a germanium PNPN switching device such as an IBM type 077 transistor manufactured by International Business Machines Corporation at Poughkeepsie, N.Y., described in more detail in U.S. Pat. 3,211,971 of F. Barson et al., issued Oct. 12, 1965, and assigned to the same assignee as the present invention. The device includes a PNP first section including emitter **41*a*, base 41*b* and collector 41*c*, and an NPN section comprising emitter 41*d*, base 41*c* and collector 41*b***.

Typical values for the sensing resistor 39, bias source 41, bias source 43 and power supply 44 are 180 ohms, 1.4 volts, 2.6 volts, and 10 volts, respectively.

The detector 42 can simply be a lamp bulb or the like. One lamp found to be satisfactory is a Dialco No. 29, 10 volt, 10 milliampere heated filament type bulb.

In operation, and assuming that initially there are good bonds, current from the bias source 43 will flow through forward bias junction or diode of the chip device 17 and the sensing resistor 39. The switching device 40 is reverse biased due to the emitter potential being above the base potential. The device 40 is nonconducting so that no current flows through detector lamp 42.

An operator positions the nozzle 30 of the air blast means a short distance from one of the bonded joints to be tested, typically 100–150 mils. The cam is actuated by means (not shown) so as to direct a high velocity blast of air from the nozzle 30 at an acute angle to the substrate surface 50, typically 15–25 degrees. The bonded joints are subjected primarily to a shearing stress caused by the force of the high velocity, low pressure air blast. If the bond is very weakly connected, either at the chip 17 to contact 16 or contact 16 to pattern 14 connection, the force of the air on the bond, typically 6 grams per contact, will blow the chip away from the substrate. In addition, if the chip is not blown away from the substrate but the bonded joint is poor or intermittent the air blast will cause a slight movement accompanied by an increase in resistance, typically more than twenty ohms. In either case, whether the chip is blown off the substrate to cause an open circuit or there is a slight movement accompanied by an increase in resistance, the decrease in current flow decreases the potential drop across sensing resistor 39 turning switching device 40 on and permitting current flow through lamp 42.

The air blast from nozzle 30 can be a steady flow. However, in order to achieve much greater accuracy in detecting these changes in resistance, the air valve 24 (FIG. 1) is pulsed to provide a pulsed air blast by means of the cam 33 actuated microswitch 34 in the solenoid energizing circuit 31. Each pulse lasts approximately one second which is much shorter then trigger circuit response time, typically 0.2 microsecond.

While the invention has been particularly shown and described with reference to the preferred embodiments thereof, it will be understood by those skilled in the art that various changes in form and detail may be made therein without departing from the spirit and scope of the invention.

What is claimed is:

1. Apparatus for testing the quality of a joint, bonding a semiconductive chip device to the surface of the substrate of a microminiature module comprising:

means for supporting said module;

means for subjecting the joint to a blast of fluid medium;

means for pulsing said blast means; and electrical resistance determining means electrically connected across the joint including a trigger circuit electrically connected to said joint having means for detecting changes in resistance when the joint is subjected to said blast pulse, the trigger circuit response being much shorter than the pulse duration and the force of said blast being sufficient to produce a detectable change in joint resistance when a device is poorly bonded to the substrate.

References Cited

UNITED STATES PATENTS

| | | | |
|---|---|---|---|
| 2,142,619 | 1/1939 | Sciaky | 324—64 |
| 2,842,957 | 7/1958 | Bacon | 73—37 |
| 3,018,656 | 1/1962 | McCreanor et al. | 73—37 |
| 3,039,604 | 6/1962 | Bickel et al. | 324—158X |
| 3,157,535 | 11/1964 | Radke | 324—65X |
| 3,178,639 | 4/1965 | Hillman | 324—54 |
| 3,192,474 | 6/1965 | Cherry | 324—65 |
| 3,286,181 | 11/1966 | Dudash et al. | 324—73X |
| 2,586,125 | 2/1952 | Van Blarcom | 324—51 |
| 3,343,107 | 9/1967 | Golightly | 29—577X |
| 3,383,760 | 5/1968 | Shwartzman | 29—577 |

FOREIGN PATENTS

| | | | |
|---|---|---|---|
| 761,241 | 11/1956 | Great Britain | 324—61 |

OTHER REFERENCES

Beliveau: "Etching, PN Junctions," IBM Technical Disclosure Bulletin, vol. 2, No. 3, October 1959, pp. 64—65.

EDWARD E. KUBASIEWICZ, Primary Examiner

U.S. Cl. X.R.

324—62; 29—574; 73—37; 324—51